(12) United States Patent
Bobba et al.

(10) Patent No.: US 6,495,926 B1
(45) Date of Patent: Dec. 17, 2002

(54) 60 DEGREE BUMP PLACEMENT LAYOUT FOR AN INTEGRATED CIRCUIT POWER GRID

(75) Inventors: Sudhakar Bobba, Sunnyvale, CA (US); Tyler Thorp, Sunnyvale, CA (US); Dean Liu, Sunnyvale, CA (US)

(73) Assignee: Sun Microsystems, Inc., CA (US)

( * ) Notice: Subject to any disclaimer, the term of this patent is extended or adjusted under 35 U.S.C. 154(b) by 0 days.

(21) Appl. No.: 09/997,471

(22) Filed: Nov. 29, 2001

(51) Int. Cl.[7] .................. H01L 23/48; H01L 23/52; H01L 29/40
(52) U.S. Cl. ........................ 257/786; 257/780
(58) Field of Search ................ 257/786, 780, 257/781, 738, 778

(56) References Cited

U.S. PATENT DOCUMENTS

| 5,959,346 | A | * | 9/1999 | Ochiai |
| 6,008,532 | A | * | 12/1999 | Takamori |
| 6,037,547 | A | * | 3/2000 | Blish, II |
| 6,088,233 | A | * | 7/2000 | Iijima et al. |
| 6,097,097 | A | * | 8/2000 | Hirose |
| 6,166,441 | A | * | 12/2000 | Geryk |
| 6,554,011 |   | * | 9/2002 | Hirano et al. |

FOREIGN PATENT DOCUMENTS

JP      2001203261 A   *   7/2001

\* cited by examiner

*Primary Examiner*—Sheila V. Clark
(74) *Attorney, Agent, or Firm*—Rosenthal & Osha L.L.P.

(57) ABSTRACT

A 60 degree bump placement layout for an integrated circuit power grid is provided. This layout improves integrated circuit performance and reliability and gives an integrated circuit designer added flexibility and uniformity in designing the integrated circuit. Further, a patterned bump array for a top metal layer of an integrated circuit having a plurality of 60 degree bump placement structures is provided.

22 Claims, 17 Drawing Sheets

US 6,495,926 B1

60 DEGREE BUMP PLACEMENT LAYOUT FOR AN INTEGRATED CIRCUIT POWER GRID

BACKGROUND OF INVENTION

A typical computer system includes at least a microprocessor and some form of memory. The microprocessor has, among other components, arithmetic, logic, and control circuitry that interpret and execute instructions necessary for the operation and use of the computer system. FIG. 1 shows a typical computer circuit board (10) having a microprocessor (12), memory (14), integrated circuits (16) that have various functionalities, and communication paths (18), i.e., buses and wires, that are necessary for the transfer of data among the aforementioned components on the circuit board (10).

Integrated circuits (16) and microprocessors (12), such as the ones shown in FIG. 1, are electrically connected, i.e., "mounted," to the circuit board (10) via chip packages. A chip package houses semiconductor devices in strong, thermally stable, hermetically-sealed environments that provide a semiconductor device, e.g., an integrated circuit, with electronic connectivity to circuitry external to the semiconductor device.

FIG. 2 shows a typical chip package assembly. In FIG. 2, an integrated circuit (20) is mounted onto a chip package (22), where an active side (24) of the integrated circuit (20) is electrically interfaced to the chip package (22). Specifically, the integrated circuit (20) has bumps (26) on bond pads (also known in the art as "landing pads") (not shown) formed on the active side (24) of the integrated circuit (20), where the bumps (26) are used as electrical and mechanical connectors. The integrated circuit (20) is inverted and bonded to the chip package(22) by means of the bumps (26). Various materials, such as conductive polymers and metals (referred to as "solder bumps"), are commonly used to form the bumps (26) on the integrated circuit (20).

As discussed above with reference to FIG. 2, the bumps (26) on the integrated circuit (20) serve as electrical pathways between components within the integrated circuit (20) and the chip package (22). Within the integrated circuit (20) itself, an arrangement of conductive pathways and metal layers form a means by which components in the integrated circuit (20) operatively connect to the bumps (26) located on an exterior region of the integrated circuit (20). To this end, FIG. 3a shows a side view of the integrated circuit (20). The integrated circuit (20) has several metal layers, M1–M8, surrounded by some dielectric material (28), e.g., silicon dioxide. The metal layers, M1–M8, are connected to each other by conductive pathways (30) known as "vias." Vias (30) are essentially holes within the dielectric material (28) that have been doped with metal ions. Further, those skilled in the art will understand that although FIG. 2 shows only eight metal layers and a particular amount of vias, integrated circuits may have any number of metal layers and/or vias.

Circuitry (not shown) embedded on a substrate of the integrated circuit (20) transmit and receive signals and power via the metal layers, M1–M8, and the vias (30). Signals that need to be transmitted/received to/from components external to the integrated circuit (20) are propagated through the metal layers, M1–M8, and vias (30) to the top metal layer, M8. The top metal layer (also referred to and known as "power grid"), M8, then transmits/receives signals and power to/from the bumps (26) located on the active side (24) of the integrated circuit (20). With respect to the power and energy needed by the integrated circuit (20), power is delivered to the integrated circuit (20) from external sources through the bumps (26) and metal layers, M1–M8. The top metal layer, M8, on the integrated circuit (20) acts as an interface between the integrated circuit (20) and the external sources/signals of power.

FIG. 3b shows a top view of the integrated circuit (20) shown in FIG. 3a. The top metal layer, M8, as shown in FIG. 3b, has a number of parallel regions, otherwise known as "metal bars." These metal bars alternate between bars connected to VDD and regions connected to Vss. Such a configuration helps reduce electromagnetic interference. The top metal layer, M8, is configured such that it is orthogonal with the metal layer below, M7, as shown in FIG. 3b. Further, bumps (26) on the top metal layer, M8, are arranged in a non-uniform fashion with some areas of the top metal layer, M8, having larger numbers of bumps (26) than other areas.

SUMMARY OF INVENTION

According to one aspect of the present invention, an integrated circuit having a top metal layer that has a first metal bar and a second metal bar comprises a first bump disposed on the first metal bar, a second bump disposed on the first metal bar, and a reference bump disposed on the second metal bar, where the first bump and the second bump are positioned such that an angle between a line from the reference bump to the first bump and a line from the reference bump to the second bump has a value substantially equal to 60 degrees.

According to another aspect, an integrated circuit having a top metal layer that has a first metal bar and a second metal bar comprises a first bump disposed on the first metal bar, a second bump disposed on the first metal bar, and a reference bump disposed on the second metal bar, where the first metal bar and the second metal bar are positioned such that an angle between a line from the reference bump to the first bump and a line from the reference bump to the second bump has a value substantially equal to 60 degrees.

A patterned bump array for a power grid of an integrated circuit comprises a reference bump disposed on a first metal bar, a first bump disposed on a second metal bar, and a second bump disposed on a second metal bar, where the first bump, the second bump, and the reference bump are arranged such that an angle between a line from the reference bump to the first bump and a line from the reference bump to the second bump has a value substantially equal to 60 degrees.

According to another aspect, a bump layout for a power grid of an integrated circuit comprises a reference bump disposed on a first metal bar, a first bump disposed on a second metal bar, and a second bump disposed on a second metal bar, where the first metal bar and the second metal bar are arranged such that an angle between a line from the reference bump to the first bump and a line from the reference bump to the second bump has a value substantially equal to 60 degrees.

Other aspects and advantages of the invention will be apparent from the following description and the appended claims.

BRIEF DESCRIPTION OF DRAWINGS

FIG. 5b shows a top metal layer of an integrated circuit in accordance with the embodiment shown in FIG. 5a.

FIG. 6b shows a top metal layer of an integrated circuit in accordance with the embodiment shown in FIG. 6a.

FIG. 7b shows a top metal layer of an integrated circuit in accordance with the embodiment shown in FIG. 7a.

FIG. 9b shows a top metal layer of an integrated circuit in accordance with the embodiment shown in FIG. 9a.

DETAILED DESCRIPTION

Embodiments of the present invention relate to a method and apparatus for improving integrated circuit performance by using a patterned bump layout on a power grid of the integrated circuit. Embodiments of the present invention further relate to a method and apparatus for improving bump placement on a top metal layer of an integrated circuit. Embodiments of the present invention further relate to a method and apparatus for creating a bump array on a top metal layer of an integrated circuit. Embodiments of the present invention further relate to a computer system that determines an optimal bump pattern given a set of conditions. Embodiments of the present invention further relate to a computer-readable medium having instructions for determining an optimal placement of bumps on an integrated circuit. Embodiments of the present invention also relate to a method for positioning a maximum number of bumps on a power grid of an integrated circuit.

Figure 1:
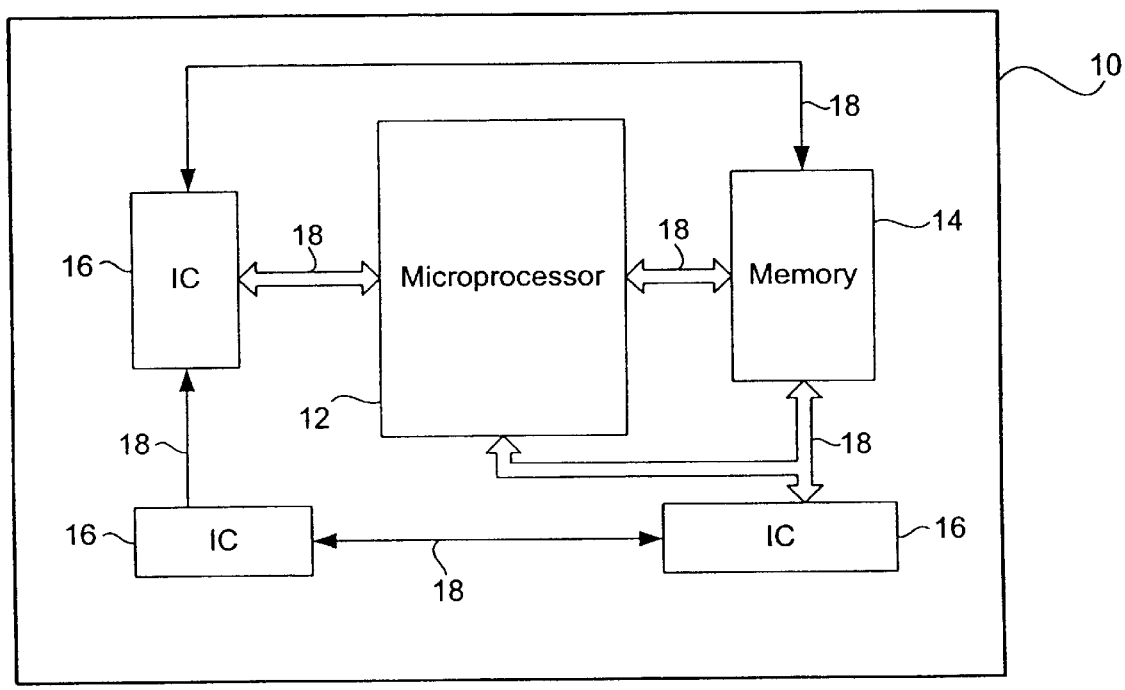
FIG. 1 shows a typical circuit board.
Figure 2:
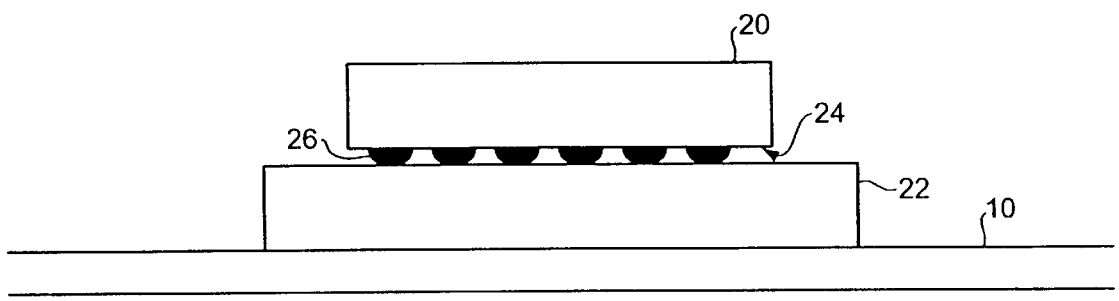
FIG. 2 shows a typical chip package assembly.
Figure 3A:
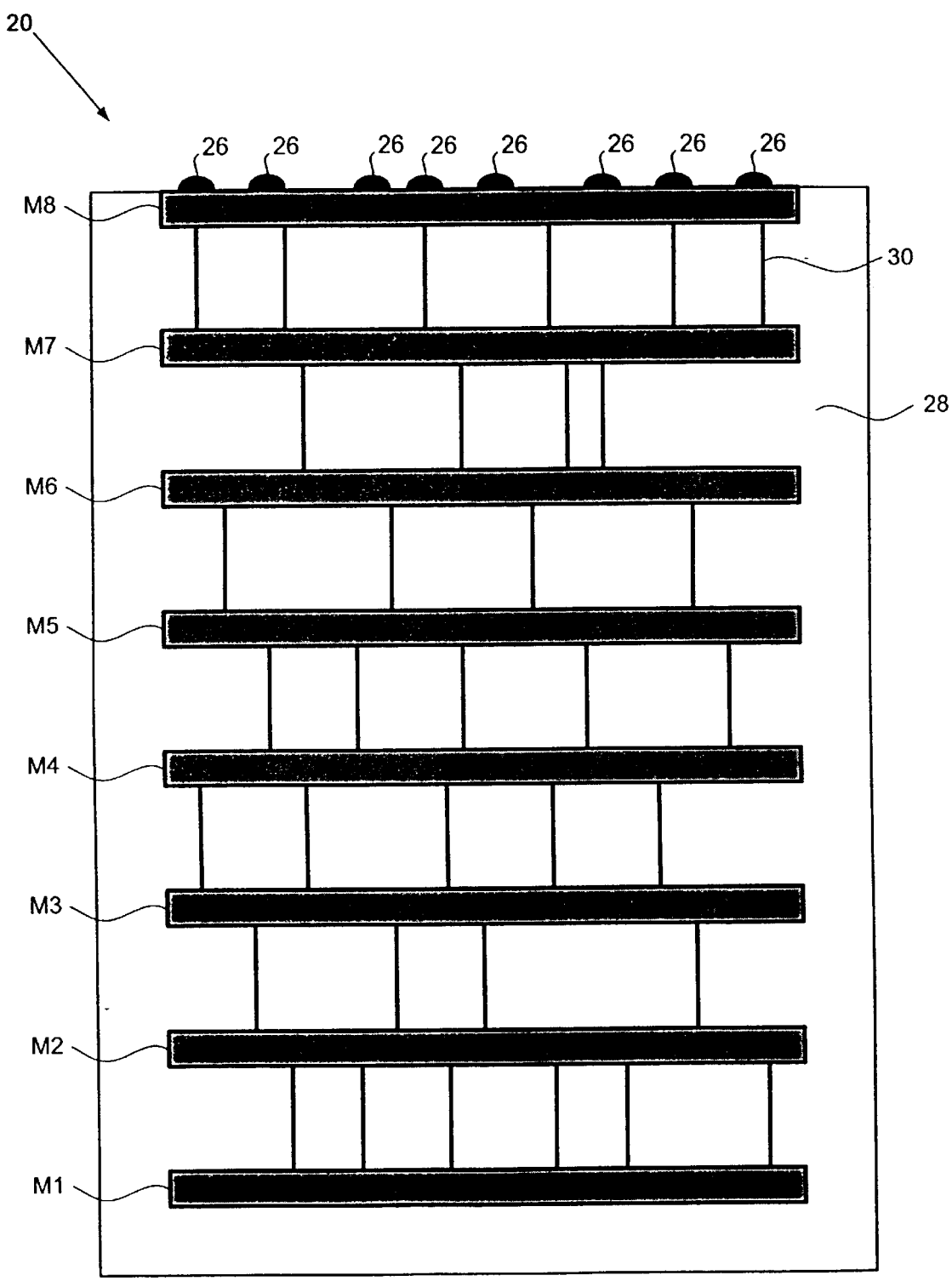
FIG. 3a shows a side view of a typical integrated circuit.
Figure 3B:
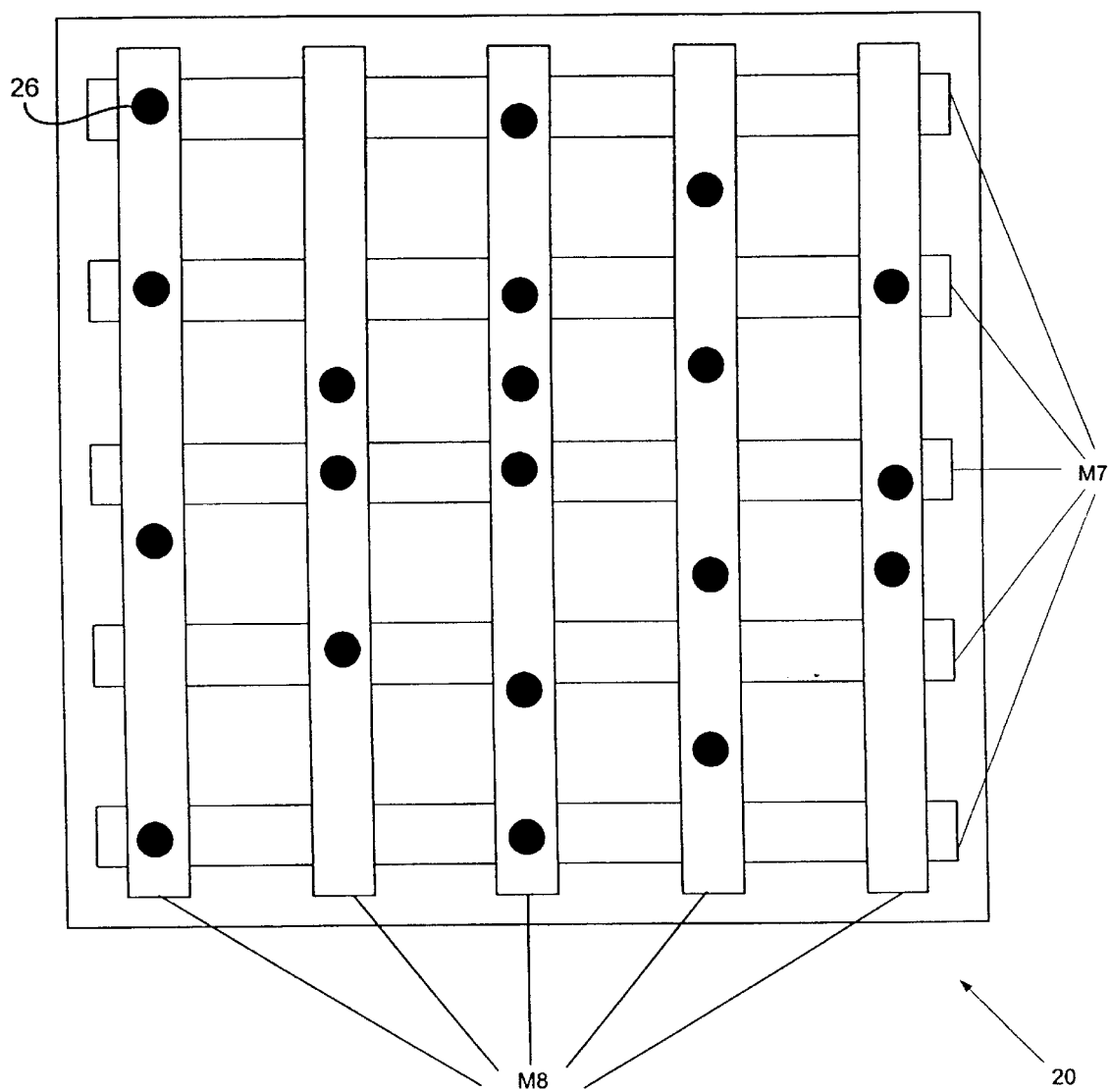
FIG. 3b shows a top view of a typical integrated circuit.
Figure 4:
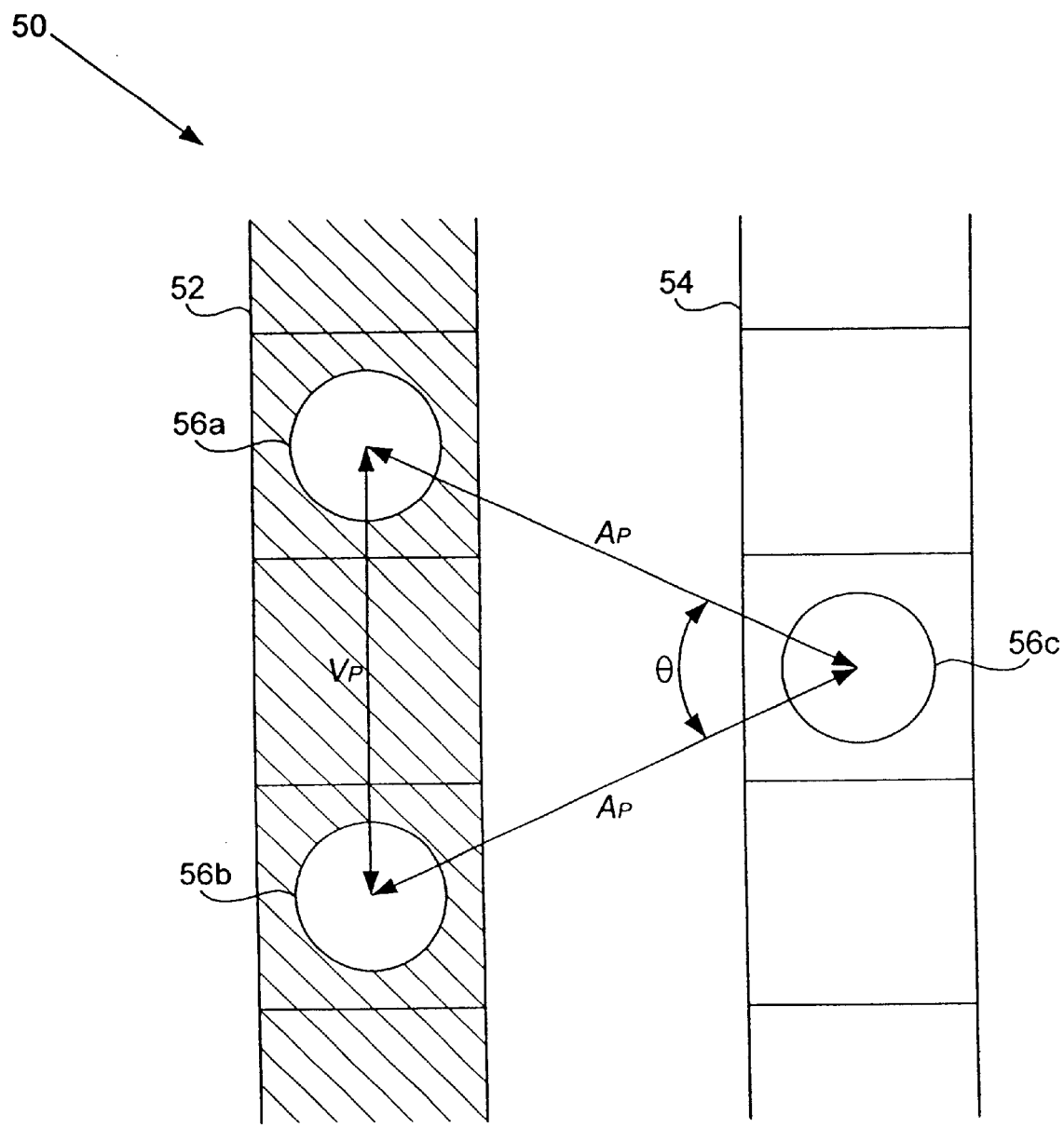
FIG. 4 shows a section of a top metal layer of an integrated circuit in accordance with an embodiment of the present invention.

FIG. 4 shows a section (50) of a top metal layer of an exemplary integrated circuit in accordance with an embodiment of the present invention. The section (50) has a first metal bar (52) connected to VDD, i.e., power, and a second metal bar (54) connected to Vss, i.e., ground. The first metal bar (52) has two bumps (56a, 56b) and the second metal bar (54) has one bump (also referred to as "reference bump") (56c).

Those skilled in the art will appreciate that although the first metal bar (52) is connected to power and the second metal bar (54) is connected to ground, in other embodiments of the present invention, the first metal bar (52) may be connected to ground and the second metal bar (54) may be connected to power.

A separation between the bumps (56a, 56b) on the first metal bar (52) is defined as a vertical pitch, $V_P$. Moreover, a distance between the first bump (56a) on the first metal bar (52) and the bump (56c) on the second metal bar (54) is defined as an across pitch, $A_P$. Likewise, $A_P$ also denotes the distance between the second bump (56b) on the first metal bar (52) and the bump (56c) on the second metal bar (54). An angle θ represents the angle between the two across pitches.

The presence of angle θ allows for the rearrangement of the bumps (56a, 56b) on the first metal bar (52) in order to create different bump patterns. Varying angle θ can be done by repositioning the bumps (56a, 56b) on the first metal bar (52) and/or adjusting the spacing between the first and second metal bars (52, 54). By effectively varying θ, properties of a top metal layer may be changed as desired. Properties dependent on the angle θ include, but are not limited to, metal layer resistance, metal layer capacitance, metal layer inductance, metal layer electrical performance, overall bump current flow, bump population, bump electromagnetivity, signal track positioning, and integration characteristics.

Once an angle θ is determined for a particular design, bumps on a top metal layer may be patterned such that the arrangement of bumps results in repetitive groups of bumps having an angle θ between across pitches in a group of bumps as shown in FIG. 4. In other words, the properties between a group of bumps as shown in FIG. 4 may be replicated across part or all of a top metal layer in order to create a particular bump array.

Figure 5A:
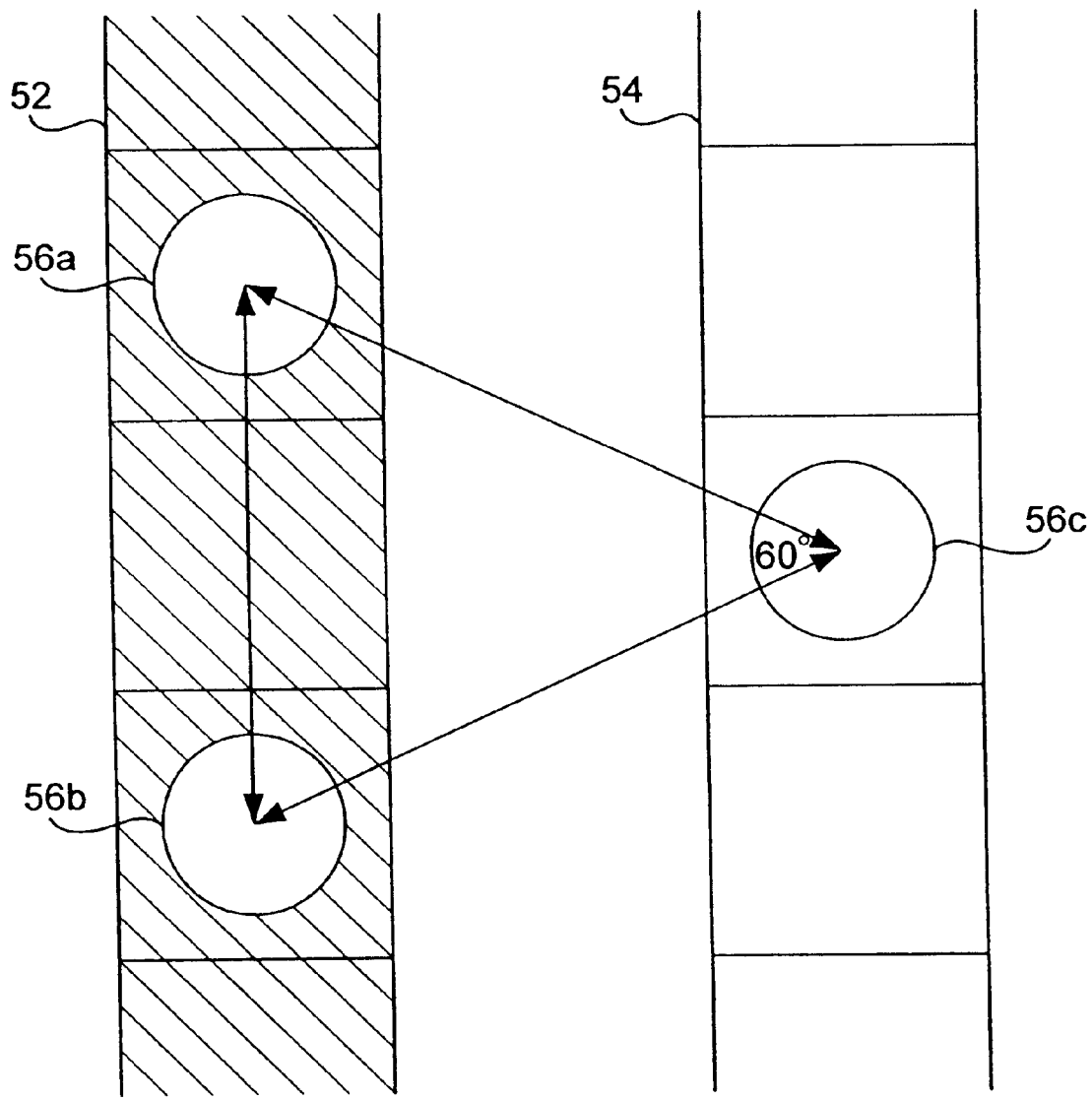
FIG. 5a shows a section of a top metal layer of an integrated circuit in accordance with an embodiment of the present invention.

FIG. 5a shows a section of a top metal layer of an integrated circuit in accordance with an embodiment of the present invention. In FIG. 5a, angle θ is set at 60 degrees. When angle θ is equal to 60 degrees, a maximum packing of bumps on a top metal layer may be achieved, as shown below with reference to FIG. 5b. This may be beneficial when the current flow capabilities for individual bumps are relatively low. In this embodiment, the number of bumps on a top metal layer is maximized, and thus, the overall amount of current that can flow from an integrated circuit to a chip package is accordingly maximized. Further, note that when angle θ is equal to 60 degrees, the distances between the bumps (56a, 56b, 56c) are all equal.

Those skilled in the art will appreciate that although angle θ is set at 60 degrees in FIG. 5a, similar bump and metal layer properties and structures may be realized using any angle θ up to 75 degrees. Further, although this embodiment will be referred to as the "60 degrees" embodiment, those skilled in the art will understand that this embodiment applies to embodiments having any angle θ up to 75 degrees. Particularly, the 60 degrees embodiment achieves the results discussed above when angle θ is substantially equal to 60 degrees.

Figure 5B:
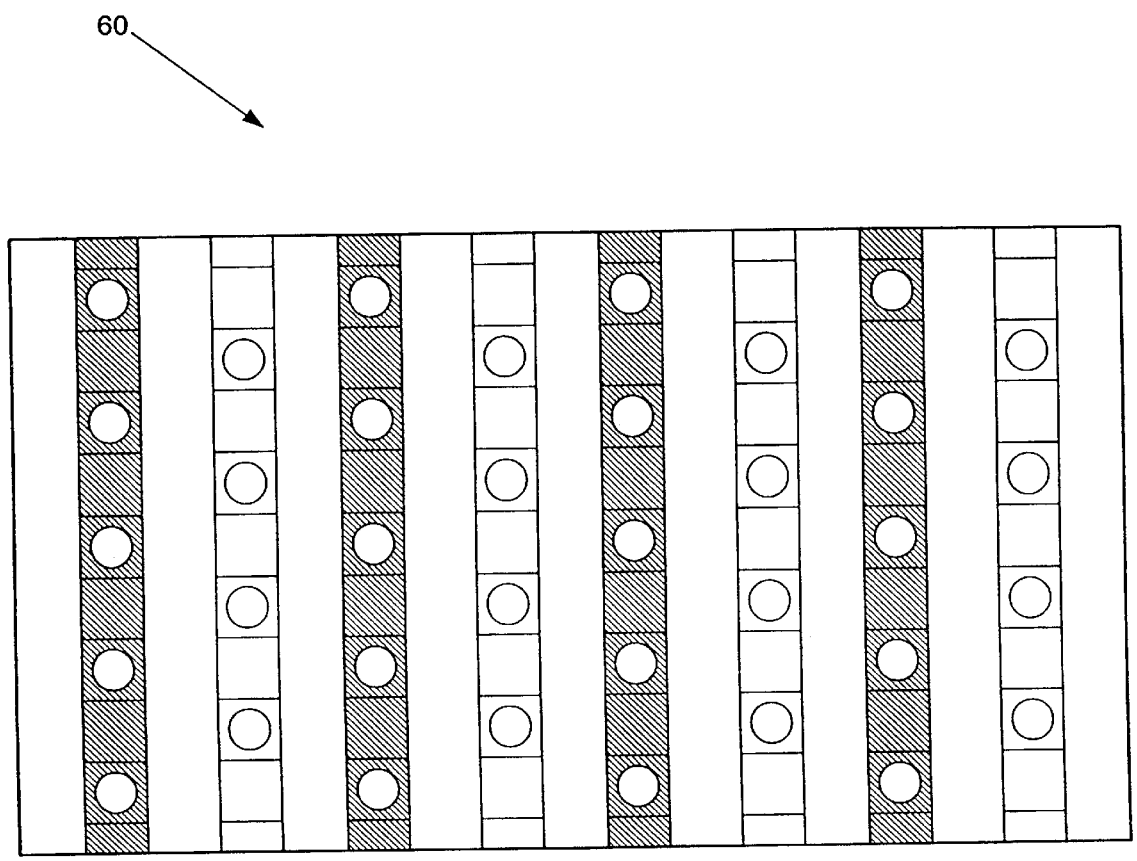

FIG. 5b shows a top metal layer (60) of an integrated circuit in accordance with the embodiment shown in FIG. 5a. In FIG. 5b, the three bump structure shown in FIG. 5a is repeated across the top metal layer (60) of an integrated circuit.

Figure 6A:
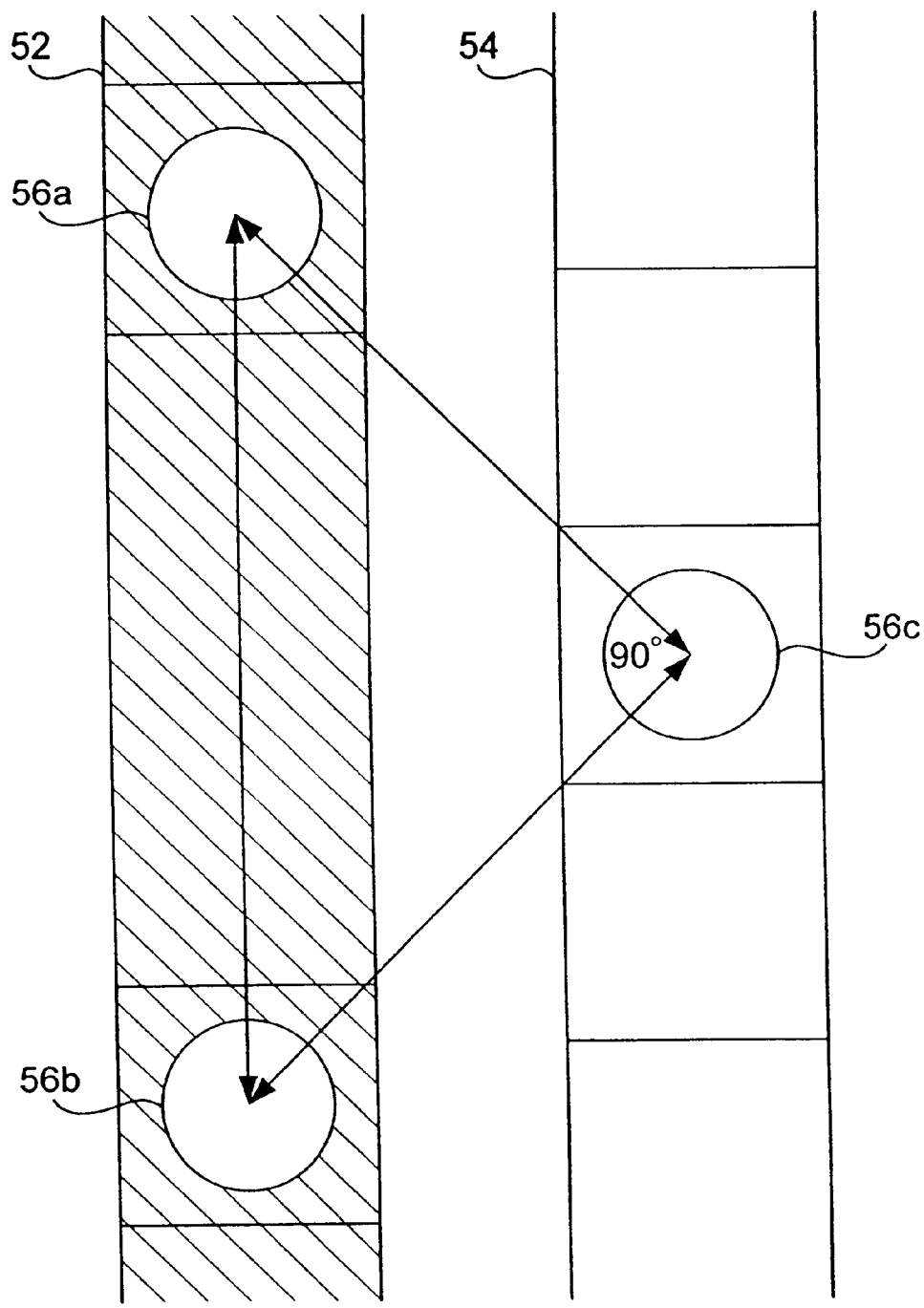
FIG. 6a shows a section of a top metal layer of an integrated circuit in accordance with another embodiment of the present invention.

FIG. 6a shows a section of a top metal layer of an integrated circuit in accordance with an embodiment of the present invention. In FIG. 6a, angle θ is set at 90 degrees. When angle θ is equal to 90 degrees, the first metal bar (52)

and second metal bar (54) are spaced closer together than the 60 degrees embodiment shown and discussed above with reference to FIG. 5a. Due to the first and second metal bars (52, 54) being closer together, there is higher capacitance between the first and second metal bars (52, 54) than there is in the 60 degrees embodiment. Further, also due to the first and second metal bars (52, 54) being spaced closer together, more metal bars can be positioned in a top metal layer than what would be possible in the 60 degrees embodiment. However, because the first and second bumps (56a, 56b) have to be spaced further apart when angle θ is 90 degrees, fewer bumps per metal bar can be positioned on a top metal layer than the 60 degrees embodiment.

Those skilled in the art will appreciate that although angle θ is set at 90 degrees in FIG. 6a, similar bump and metal layer properties and structures may be realized using any angle θ from 76 degrees up to 105 degrees. Further, although this embodiment will be referred to as the "90 degrees" embodiment, those skilled in the art will understand that this embodiment applies to embodiments having any angle θ from 76 degrees up to 105 degrees. Particularly, the 90 degrees embodiment achieves the results discussed above when angle θ is substantially equal to 90 degrees.

Figure 6B:
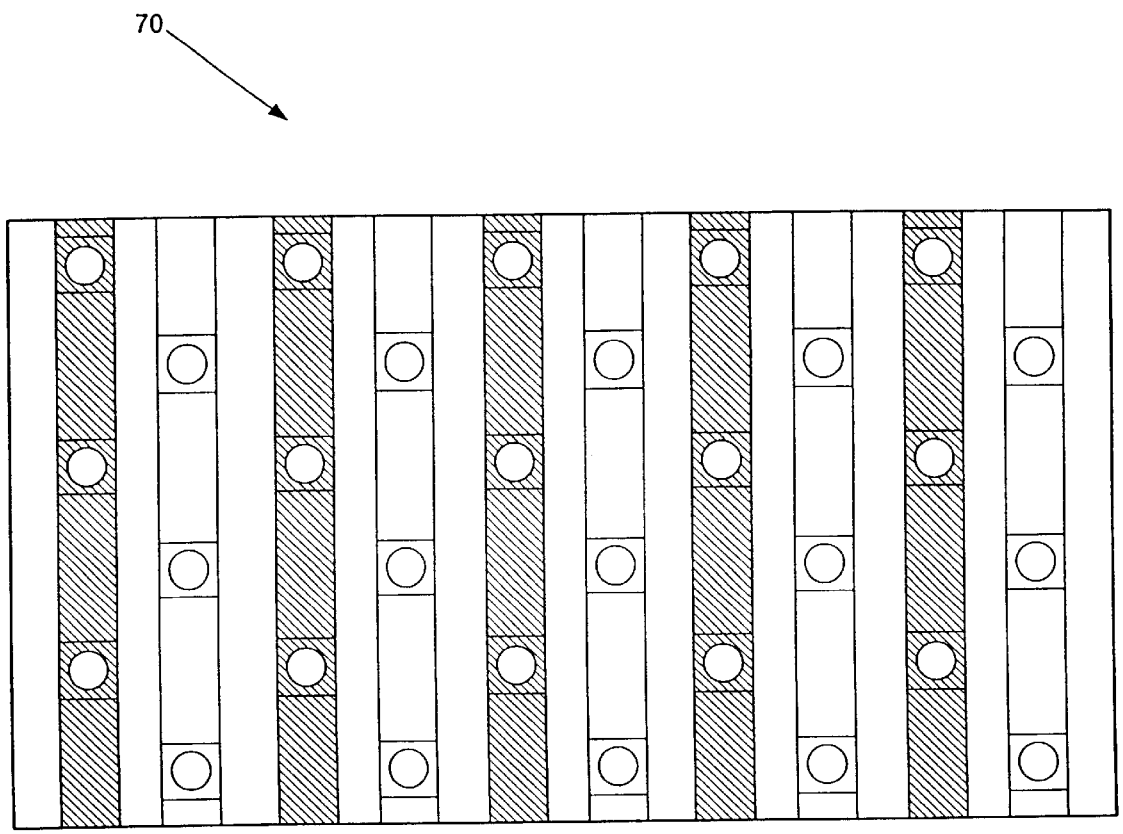

FIG. 6b shows a top metal layer (70) of an integrated circuit in accordance with the embodiment shown in FIG. 6a. In FIG. 6b, the three bump structure shown in FIG. 6a is repeated across the top metal layer (70) of an integrated circuit.

Figure 7A:
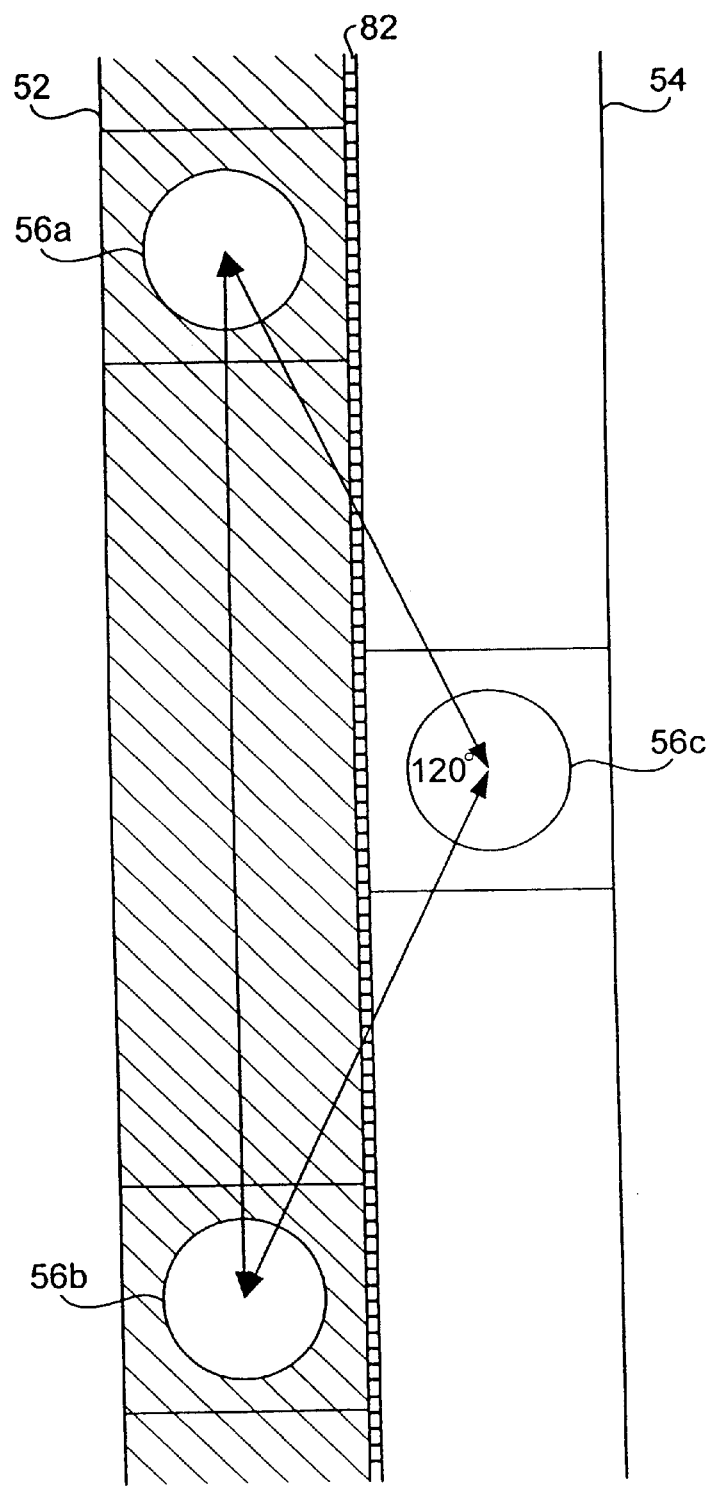
FIG. 7a shows a section of a top metal layer of an integrated circuit in accordance with another embodiment of the present invention.

FIG. 7a shows a section of a top metal layer of an integrated circuit in accordance with an embodiment of the present invention. In FIG. 7a, angle θ is set at 120 degrees. When angle θ is equal to 120 degrees, the first metal bar (52) and second metal bar (54) are virtually touching each other. However, because an electrical short would occur if the first and second metal bars (52, 54) actually touched each other, a minimum amount of spacing (82) between the first and second metal bars (52, 54) is present between the first and second metal bars (52, 54) to ensure that the first and second metal bars (52, 54) do not come into contact with each other.

Further, in the embodiment shown in FIG. 7a, less bumps per metal bar can be positioned on a top metal layer than the 90 degrees embodiment shown and discussed above with reference to FIG. 6a. However, because the first and second metal bars (52, 54) in FIG. 7a are spaced closer together than the metal bars shown in FIG. 6b, more metal bars can be positioned on a top metal layer than what would be possible in the 90 degrees embodiment.

Those skilled in the art will appreciate that although angle θ is set at 120 degrees in FIG. 7a, similar bump and metal layer properties and structures may be realized using any angle θ from 106 degrees up to 135 degrees. Further, although this embodiment will be referred to as the "120 degrees" embodiment, those skilled in the art will understand that this embodiment applies to embodiments having any angle θ from 106 degrees up to 135 degrees. Particularly, the 120 degrees embodiment achieves the results discussed above when angle θ is substantially equal to 120 degrees.

Figure 7B:
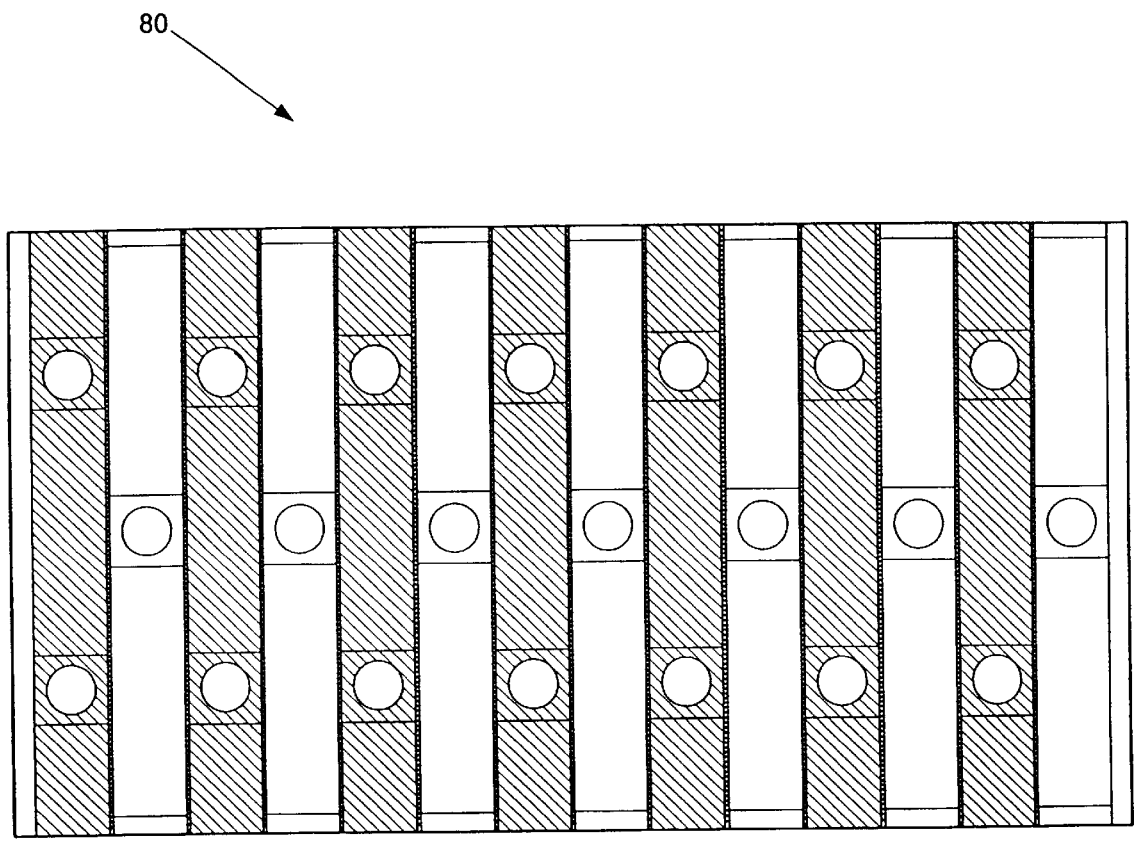

FIG. 7b shows a top metal layer (80) of an integrated circuit in accordance with the embodiment shown in FIG. 7a. In FIG. 7b, the three bump structure shown in FIG. 7a is repeated across the top metal layer (80) of an integrated circuit.

Figure 8A:
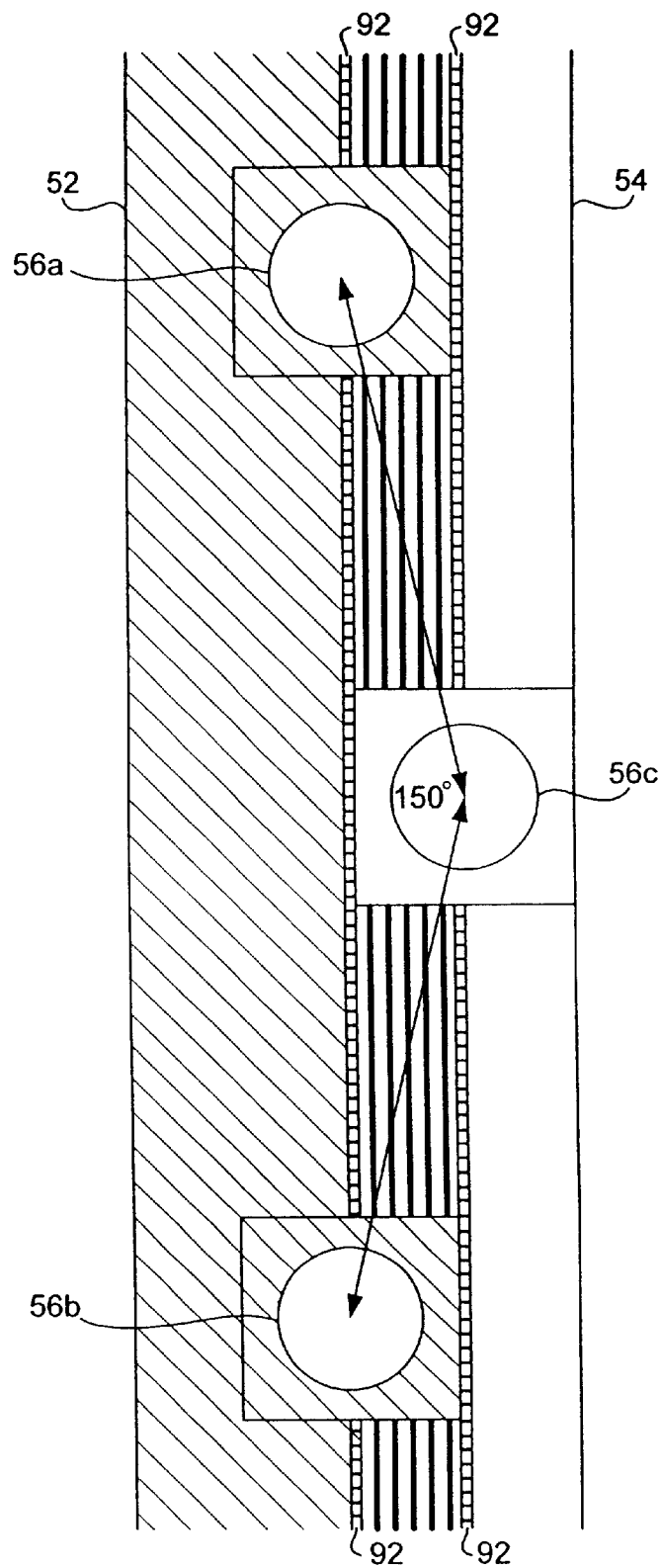
FIG. 8a shows a section of a top metal layer of an integrated circuit in accordance with another embodiment of the present invention.

FIG. 8a shows a section of a top metal layer of an integrated circuit in accordance with an embodiment of the present invention. In FIG. 8a, angle θ is set at 150 degrees. When angle θ is equal to 150 degrees, the first and second metal bars (52, 54) are essentially "interlocked." As shown in FIG. 8a, to ensure that the first and second metal bars (52, 54) do not physically touch each other, the first and metal bars (52, 54) are configured, i.e., designed, in a "stair-case" pattern such that there is some finite amount of spacing (92) between the first and second metal bars (52, 54). Further, as shown in FIG. 8a, the bumps (56a, 56b, 56c) are partially aligned. Also, the landing pad size of the bumps (56a, 56b, 56c) may be changed because this embodiment is, to a certain extent, immune to bump placement variations.

In the embodiment shown in FIG. 8a, due to the interlocked structure of the metal bars (52, 54), the amount of capacitance present is higher than is present in the 120 degrees embodiment. Further, more metal bars can be positioned in a top metal layer using the 120 degrees embodiment than what would be possible in the 120 degrees embodiment. However, because bumps on a particular metal bar are spaced further apart in FIG. 8a, fewer bumps per metal bar can be positioned on a top metal layer than the 120 degrees embodiment.

In another embodiment, the width of the first and second metal bars (52, 54) may be shortened so as to allow more spacing on the sides of the interlocked structure formed by the first and second metal bars (52, 54). This can be done without affecting the electrical properties among the first metal bar (52), the second metal bar (54), and the bumps (56a, 56b, 56c). By allowing more spacing on the sides of the interlocked structure, there is additional space to route signals and signal tracks. This embodiment may be viewed as a "150 degrees narrow" approach.

Figure 8B:
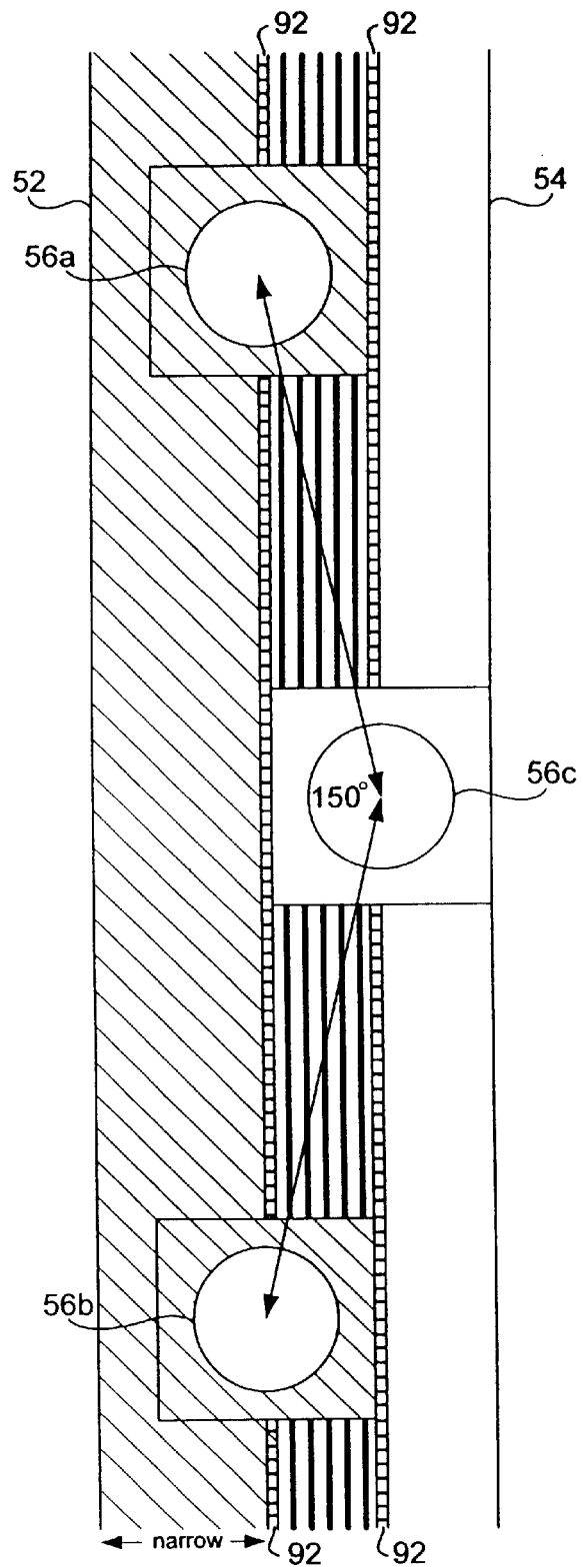
FIG. 8b shows a section of a top metal layer of an integrated circuit in accordance with another embodiment of the present invention.

Those skilled in the art will appreciate that although angle θ is set at 150 degrees in FIGS. 8a and 8b, similar bump and metal layer properties and structures may be realized using any angle θ from 136 degrees up to 165 degrees. Further, although the embodiments shown in FIGS. 8a and 8b will collectively be referred to as the "150 degrees" embodiment, those skilled in the art will understand that this embodiment applies to embodiments having any angle θ from 136 degrees up to 165 degrees. Particularly, the 120 degrees embodiment achieves the results discussed above when angle θ is substantially equal to 120 degrees.

Figure 8C:
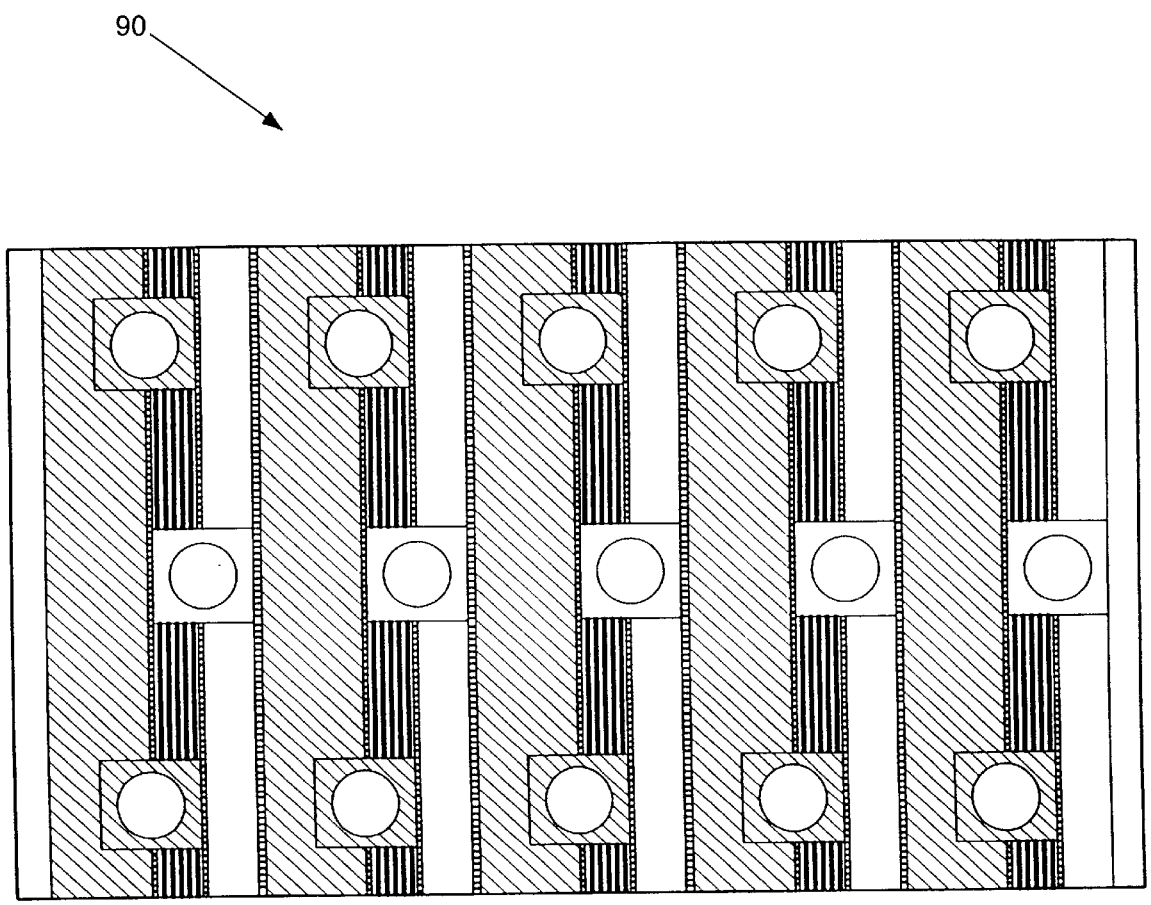
FIG. 8c shows a top metal layer of an integrated circuit in accordance with the embodiments shown in FIGS. 8a and 8b.

FIG. 8c shows a top metal layer (90) of an integrated circuit in accordance with the embodiments shown in FIGS. 8a and 8b. In FIG. 8c, the three bump structure shown in FIGS. 8a and 8b is repeated across the top metal layer (90) of an integrated circuit.

It is important to note that in the 120 and 150 degrees embodiments, the width of the metal bars is approximately equal to the width of the landing pads of the bumps. Landing pad size is usually part of design rules for a particular power grid. It follows that the minimal allowable spacing between two bumps is twice the size of a landing pad. Depending on the width of a particular metal bar and a width of a particular landing pad, different bump structures may be realized. Further, those skilled in the art will appreciate that for different design rules/constraints, the angles may change. Nonetheless, the principles of the present invention are consistent with embodiments in which this occurs.

Figure 9A:
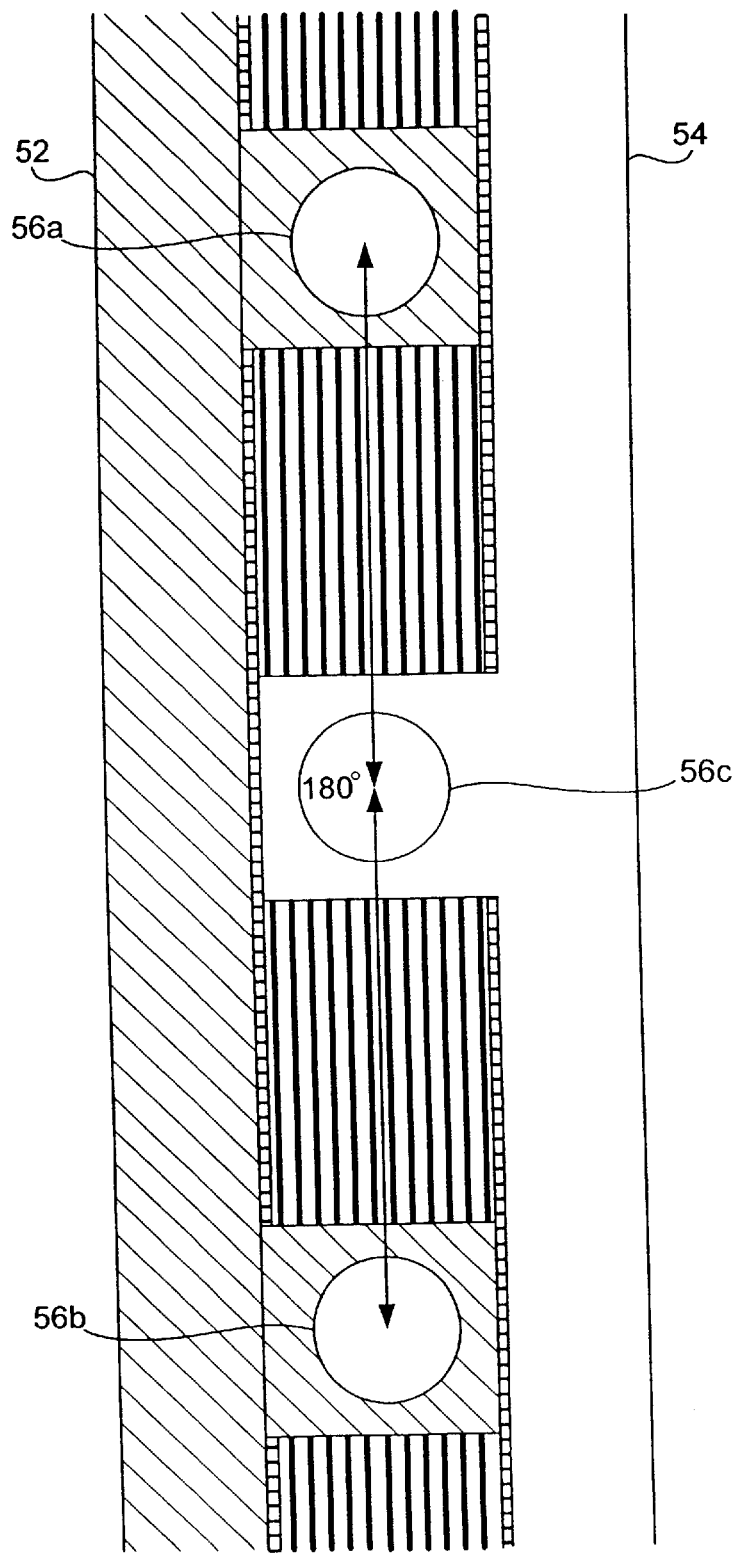
FIG. 9a shows a section of a top metal layer of an integrated circuit in accordance with another embodiment of the present invention.

FIG. 9a shows a section of a top metal layer of an integrated circuit in accordance with an embodiment of the present invention. In FIG. 9a, angle θ is set at 180 degrees. When angle θ is equal to 180 degrees, the first and second metal bars (52, 54) are "interlocked." As shown in FIG. 9a, to ensure that the first and second metal bars (52, 54) do not physically touch each other, the first and metal bars (52, 54)

are configured, i.e., designed, in a "stair-case" pattern such that there is some finite amount of spacing (102) between the first and second metal bars (52, 54). Further, as shown in FIG. 9a, the bumps (56a, 56b, 56c) are aligned.

In the embodiment shown in FIG. 9a, due to the interlocked structure of the metal bars (52, 54), the amount of capacitance present is higher than is present in the 150 degrees embodiment. Further, more metal bars can be positioned in a top metal layer using the 180 degrees embodiment than what would be possible in the 150 degrees embodiment. However, because bumps on a particular metal bar are spaced further apart in FIG. 9a, fewer bumps per metal bar can be positioned on a top metal layer than the 150 degrees embodiment.

Those skilled in the art will appreciate that although angle θ is set at 180 degrees in FIG. 9a, similar bump and metal layer properties and structures may be realized using any angle θ greater than or equal to 166 degrees. Further, although this embodiment will be referred to as the "180 degrees" embodiment, those skilled in the art will understand that this embodiment applies to embodiments having any angle θ greater than or equal to 166 degrees. Particularly, the 180 degrees embodiment achieves the results discussed above when angle θ is substantially equal to 180 degrees.

Figure 9B:
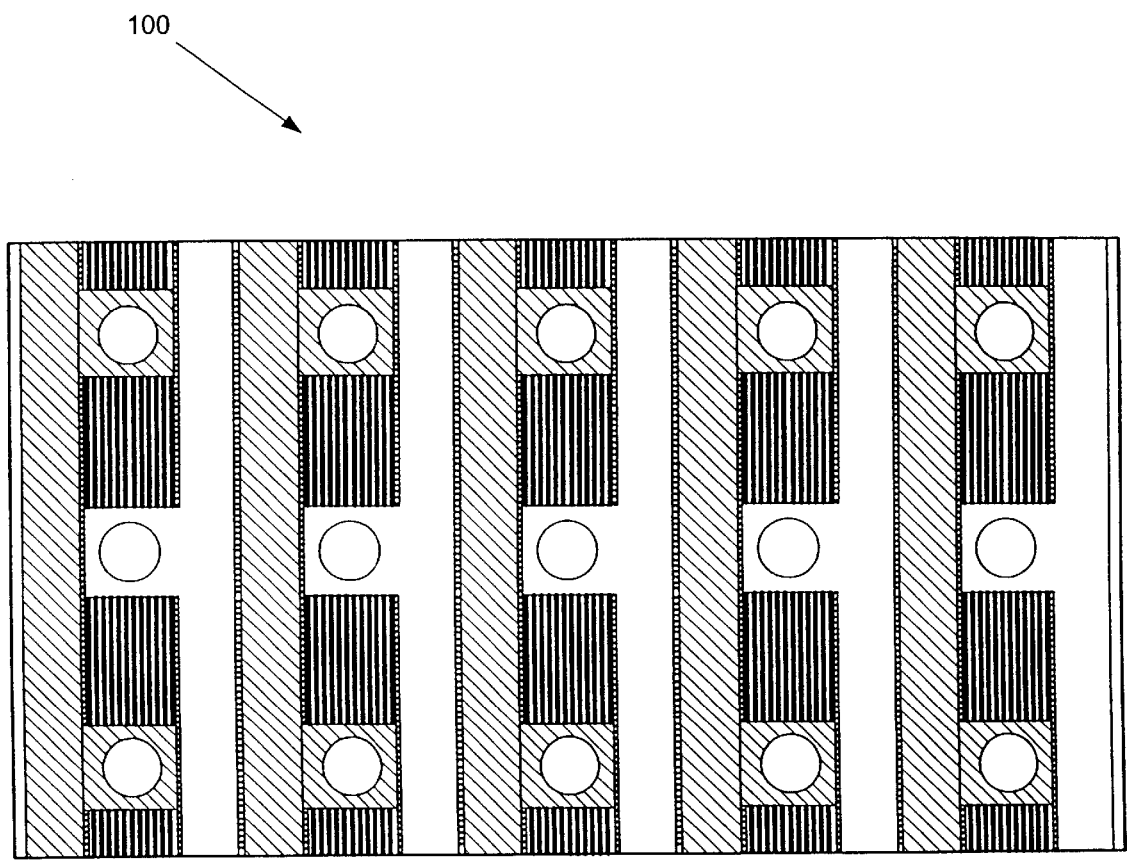

FIG. 9b shows a top metal layer (100) of an integrated circuit in accordance with the embodiment shown in FIG. 9a. In FIG. 9b, the three bump structure shown in FIG. 9a is repeated across the top metal layer (100) of an integrated circuit.

Those skilled in the art will appreciate that although the various embodiments of the present invention are shown as the first metal bar (52) and second metal bar (54) get closer together, similar angles may be achieved by increasing/decreasing spacing between bumps on a particular metal bar.

Those skilled in the art will appreciate that the various embodiments described above with reference to FIGS. 5a, 6a, 7a, 8a, 8b, and 9a may be partially or wholly combined in a top metal layer to effectuate a particular desired behavior of an integrated circuit and/or of a chip package operatively connected to the integrated circuit.

Figure 10:
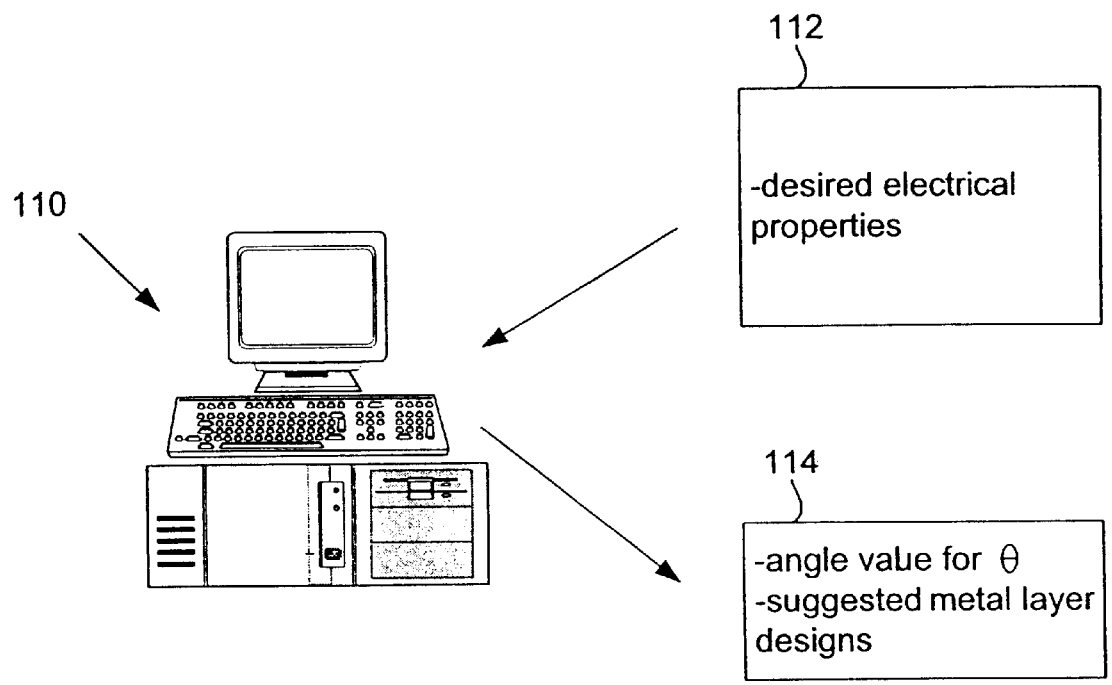
FIG. 10 shows a computer system in accordance with an embodiment of the present invention.

FIG. 10 shows an exemplary computer system (110) in accordance with an embodiment of the present invention. The computer system (110) is capable of determining a value to which angle θ needs to be varied according to various factors provided by a designer and/or computer program. Input parameters (112) to the computer system (110) may include, among other things, a desired capacitance between metal bars, a desired resistance between metal bars, a desired inductance due to metal bars, a desired bump current flow to/from a top metal layer of an integrated circuit, a desired bump population on the top metal layer, and a desired amount of space to be available for signals and/or signal tracks on the top metal layer. One of ordinary skill in the art will understand that the input parameters (112) may include additional information corresponding to particular properties and characteristics of the metal bars and bumps that are going to be used in the design.

The input parameters (112) serve as input data to the computer system (110) via some computer-readable medium, e.g., network path, floppy disk, input file, etc. The computer system (110) then stores the input parameters (112) in memory (not shown) to subsequently determine (via microprocessor functions) a value of angle θ that will most closely achieve the behavior desired by the designer. Thereafter, the computer system (110) the determined θ value (114) via some user-readable medium, e.g., monitor display, network path, etc. The computer system (110) may also determine and output one or more suggested top metal layer designs in accordance with the designer's specifications.

Those skilled in the art will appreciate that in other embodiments, a computer-readable medium may be used, where the computer-readable medium has instructions for, among other things, determining a value of an angle between a line from a reference bump to a first bump and a line from a reference bump to a second bump. The determination by the instructions may be dependent on various desired metal layer properties provided by a designer, a computer system, or other software program.

Advantages of the present invention may include one or more of the following. In some embodiments, because an angle may be varied to create various bump placements, a designer is provided with added flexibility in determining a particular bump layout for a top metal layer of an integrated circuit.

In some embodiments, because a determination of a value of an angle between a line from a reference bump to a first bump and a line from the reference bump to a second bump is dependent on various desired electrical properties, a bump placement that meets particular electrical needs may be generated.

In some embodiments, because an angle is used to characterize a particular placement of bumps, a bump layout of a top metal layer may be patterned to achieve increased efficiency and/or performance.

In some embodiments, because a bump layout of a top metal layer is improved by characterizing particular placements of bumps by an angle, integrated circuit performance may be improved.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit having a top metal layer, the top metal layer having a first metal bar and a second metal bar, the integrated circuit comprising:

a first bump disposed on the first metal bar;

a second bump disposed on the first metal bar; and a reference bump disposed on the second metal bar, wherein the first bump and the second bump are positioned such that an angle between a line from the reference bump to the first bump and a line from the reference bump to the second bump has a value substantially equal to 60 degrees.

2. The integrated circuit of claim 1, wherein the first bump, the second bump, and the reference bump form a bump structure that is repeated across the top metal layer to form a patterned bump array.

3. The integrated circuit of claim 1, wherein the first bump, the second bump, and the reference bump for a bump structure that is repeated across a portion of the top metal layer.

4. The integrated circuit of claim 1, wherein the first metal bar is operatively connected to a voltage source, and wherein the second metal bar is operatively connected to ground.

5. The integrated circuit of claim 1, wherein the value of the angle is dependent on at least one selected from the group consisting of: a desired capacitance, a desired resistance, a desired inductance, a desired bump current flow, a desired bump population on the top metal layer, and desired signal track availability.

6. An integrated circuit having a top metal layer, the top metal layer having a first metal bar and a second metal bar, the integrated circuit comprising:

a first bump disposed on the first metal bar;

a second bump disposed on the first metal bar; and a reference bump disposed on the second metal bar, wherein the first metal bar and the second metal bar are positioned such that an angle between a line from the reference bump to the first bump and a line from the reference bump to the second bump has a value substantially equal to 60 degrees.

7. The integrated circuit of claim 6, wherein the first bump, the second bump, and the reference bump form a bump structure that is repeated across the top metal layer to form a patterned bump array.

8. The integrated circuit of claim 6, wherein the first bump, the second bump, and the reference bump for a bump structure that is repeated across a portion of the top metal layer.

9. The integrated circuit of claim 6, wherein the first metal bar is operatively connected to a voltage source, and wherein the second metal bar is operatively connected to ground.

10. The integrated circuit of claim 6, wherein the value of the angle is dependent on at least one selected from the group consisting of: a desired capacitance, a desired resistance, a desired inductance, a desired bump current flow, a desired bump population on the top metal layer, and desired signal track availability.

11. A patterned bump array for a power grid of an integrated circuit, comprising:

a reference bump disposed on a first metal bar;

a first bump disposed on a second metal bar; and a second bump disposed on a second metal bar, wherein the first bump, the second bump, and the reference bump are arranged such that an angle between a line from the reference bump to the first bump and a line from the reference bump to the second bump has a value substantially equal to 60 degrees.

12. The patterned bump array of claim 11, wherein the first metal bar and second metal bar form a portion of the power grid.

13. The patterned bump array of claim 11, wherein the first metal bar is operatively connected to power, and wherein the second metal bar is operatively connected to ground.

14. The patterned bump array of claim 11, wherein the arrangement of the first bump, the second bump, and the reference bump is repeated across the power grid.

15. The patterned bump array of claim 11, wherein the arrangement of the first bump, the second bump, and the reference bump is repeated across a portion of the power grid.

16. The patterned bump array of claim 11, wherein the value of the angle is dependent on at least one selected from the group consisting of: a desired capacitance, a desired resistance, a desired inductance, a desired bump current flow, a desired bump population on the top metal layer, and desired signal track availability.

17. A bump layout for a power grid of an integrated circuit, comprising:

a reference bump disposed on a first metal bar;

a first bump disposed on a second metal bar; and a second bump disposed on a second metal bar, wherein the first metal bar and the second metal bar are arranged such that an angle between a line from the reference bump to the first bump and a line from the reference bump to the second bump has a value substantially equal to 60 degrees.

18. The bump layout of claim 17, wherein the first metal bar and second metal bar form a portion of the power grid.

19. The bump layout of claim 17, wherein the first metal bar is operatively connected to power, and wherein the second metal bar is operatively connected to ground.

20. The bump layout of claim 17, wherein the arrangement of the first metal bar and the second metal bar is repeated across the power grid.

21. The bump layout of claim 17, wherein the arrangement of the first metal bar and the second metal bar is repeated across a portion of the power grid.

22. The bump layout of claim 17, wherein the value of the angle is dependent on at least one selected from the group consisting of: a desired capacitance, a desired resistance, a desired inductance, a desired bump current flow, a desired bump population on the top metal layer, and desired signal track availability.

* * * * *